(12) United States Patent
Yang

(10) Patent No.: US 7,535,057 B2
(45) Date of Patent: May 19, 2009

(54) DMOS TRANSISTOR WITH A POLY-FILLED DEEP TRENCH FOR IMPROVED PERFORMANCE

(76) Inventor: Robert Kuo-Chang Yang, 185 Estancia Dr., Apt. #355, San Jose, CA (US) 95134

( * ) Notice: Subject to any disclaimer, the term of this patent is extended or adjusted under 35 U.S.C. 154(b) by 497 days.

(21) Appl. No.: 11/234,519

(22) Filed: Sep. 23, 2005

(65) Prior Publication Data
US 2006/0267044 A1  Nov. 30, 2006

Related U.S. Application Data

(60) Provisional application No. 60/684,401, filed on May 24, 2005.

(51) Int. Cl.
*H01L 29/76* (2006.01)
(52) U.S. Cl. .................. 257/335; 257/492; 257/493; 257/520; 257/E29.256
(58) Field of Classification Search ............. 257/492, 257/493, 335, 520, E29.256
See application file for complete search history.

(56) References Cited

U.S. PATENT DOCUMENTS

| | | | |
|---|---|---|---|
| 5,204,545 A | | 4/1993 | Terashima |
| 5,233,215 A | | 8/1993 | Baliga |
| 5,334,546 A | | 8/1994 | Terashima |
| 6,104,054 A | * | 8/2000 | Corsi et al. ............ 257/306 |
| 6,110,804 A | | 8/2000 | Parthasarathy et al. |
| 6,190,948 B1 | | 2/2001 | Seok |
| 6,242,787 B1 | * | 6/2001 | Nakayama et al. ........ 257/493 |
| 6,246,101 B1 | | 6/2001 | Akiyama |
| 6,452,230 B1 | | 9/2002 | Boden, Jr. |
| 6,608,350 B2 | | 8/2003 | Kinzer et al. |
| 6,683,363 B2 | * | 1/2004 | Challa ................. 257/496 |
| 6,717,230 B2 | | 4/2004 | Kocon |
| 6,750,506 B2 | | 6/2004 | Noda et al. |
| 6,750,524 B2 | * | 6/2004 | Parthasarathy et al. ...... 257/492 |
| 6,774,434 B2 | | 8/2004 | Hueting et al. |
| 6,774,734 B2 | | 8/2004 | Christensen et al. |
| 6,828,631 B2 | | 12/2004 | Rumennik et al. |
| 6,873,011 B1 | | 3/2005 | Huang et al. |
| 6,879,005 B2 | | 4/2005 | Yamaguchi et al. |
| 6,888,213 B2 | * | 5/2005 | Leonardi et al. .......... 257/506 |

(Continued)

OTHER PUBLICATIONS

Yung C. Liang et al., "Tunable Oxide-Bypassed VDMOS (OBVDMOS): Breaking the Silicon Limit for the Second Generation," Department of Electrical and Computer Engineering, National University of Singapore 2002, paper, pp. 201-204.

(Continued)

*Primary Examiner*—Eugene Lee
(74) *Attorney, Agent, or Firm*—Patent Law Group LLP; Brian D. Ogonowsky

(57) ABSTRACT

Floating trenches are arranged in the layout of a single DMOS transistor or an array of DMOS transistors, the array forming a single power transistor. The trenches run perpendicular to the gate width direction either outside the transistor(s) or between rows of the transistors. The floating trenches are at a potential between the drain voltage and the substrate voltage (usually ground). The potentials of the opposing trenches cause merging depletion regions in the drift region. This merging shapes the field lines so as to increase the breakdown voltage of the transistor and provide other advantages. The technique is applicable to both lateral and vertical DMOS transistors.

20 Claims, 9 Drawing Sheets

U.S. PATENT DOCUMENTS

| | | | |
|---|---|---|---|
| 6,903,421 | B1 | 6/2005 | Huang et al. |
| 6,987,299 | B2 | 1/2006 | Disney et al. |
| 6,989,566 | B2 | 1/2006 | Noda et al. |
| 6,995,428 | B2 | 2/2006 | Huang et al. |
| 7,078,783 | B2 | 7/2006 | Lanois |
| 7,265,416 | B2 * | 9/2007 | Choi et al. .................. 257/343 |
| 7,345,342 | B2 * | 3/2008 | Challa et al. ................. 257/341 |
| 7,352,036 | B2 * | 4/2008 | Grebs et al. .................. 257/401 |
| 2005/0156232 | A1 | 7/2005 | Hueting et al. |
| 2006/0118833 | A1 | 6/2006 | Lanois |

OTHER PUBLICATIONS

Yung C. Liang et al., "Oxide Bypassed VDMOS (OBVDMOS): An Alternative to Superjuntion High Voltage MOS Power Devices," IEEE Electron Devices Letters, vol. 22, No. 8, Aug. 2001, pp. 407-409.

Xin Yang et al., "Tunable Oxide-Bypassed Trench Gate MOSFET: Breaking the Ideal Superjunction MOSFET Performance Line at Equal Column Width," IEEE Electron Device Letters, vol. 24, No. 11, Nov. 2003, pp. 704-706.

R. Van Dalen et al., "Breaking the Silicon limit using semi-insulating Resurf layers," Proceedings of 2001 International Symposium on Power Semiconductor Devices & ICs, Osaka, pp. 391-394.

Hidefumi Takaya et al., Floating Island and Thick Bottom Oxide Trench Gate MOSFET (FITMOS) -A 60V Ultra Low On-Resistance Novel MOSFET with Superior Internal Body Diode-, Proceedings of the 17th International Symposium on Power Semiconductor Devices & IC's, May 23-26, 2005, Sants Barbara, CA, pp. 43-46.

V. Parthasarathy et al., "A 0.25µm CMOS based 70V smart power technology with deep trench for high-voltage isolation," 2002 IEEE, pp. 459-462-IEDM.

Andy Strachan et al., "A Trench-Isolated Power BICMOS Process with Complimentary High Performance Vertical Bipolars," paper, Advanced Process Technology Development, National Semiconductor, 4 pages.

Won-So Son et al., "A New SOI LDMOSFET Structure with a Trench in the Drift Region for a PDP Scan Driver IC", ETRI Journal, vol. 26, No. 1, 2004, pp. 7-12.

* cited by examiner

DMOS TRANSISTOR WITH A POLY-FILLED DEEP TRENCH FOR IMPROVED PERFORMANCE

CROSS-REFERENCE TO RELATED APPLICATIONS

This application claims the benefit of provisional application 60/684,401, filed May 24, 2005, entitled "DMOS Transistor with a Poly-Filled Deep Trench for Improved Performance."

FIELD OF THE INVENTION

This invention relates to double-diffused metal-oxide-semiconductor (DMOS) transistors and, in particular, to a technique for forming floating trenches proximate to DMOS transistors for improved performance of the DMOS transistors, including increased breakdown voltage.

BACKGROUND

Deep trench isolation is commonly used in many bipolar and BiCMOS process technologies. It offers significant die size reduction over junction-isolated processes, as described in the following references: 1) Strachan et al, "A Trench-Isolated Power BiCMOS Process with Complementary High Performance Bipolars", pp. 41-44, BCTM 2002; and 2) Parthasrathy et al, "A 0.25 um CMOS Based 70V Smart Power Technology with Deep Trench for High-Voltage Isolation", pp. 459-462, IEDM, 2002, all incorporated herein by reference.

The trench is typically formed as a ring surrounding the entire transistor. FIG. 1 is a cross-sectional view of a prior art floating trench. The trench 10 is typically formed in silicon 11. The trench is lined with a thin liner oxide 12 and filled with polysilicon 14. The trench is sealed with field oxide (FOX) 16 on top. The trench 10 is always left electrically floating. The floating trench increases the breakdown voltage at the edge of the transistor by reducing field crowding at the edge, as described in U.S. Pat. No. 5,233,215 to Baliga and U.S. Pat. No. 6,246,101 to Akiyama. Both of these are field spreading techniques used only at the device edge or termination but not used in the active device region.

SUMMARY

High-side lateral DMOS (LDMOS) transistor performance in a trench-isolated process is significantly improved by the layout technique discussed herein. In a DMOS transistor, a gate overlaps a drain drift region. The technique utilizes two opposing floating trenches, with the transistor in-between, with each trench having a potential determined by the capacitive coupling between the drain bias voltage and the p-substrate bias (e.g., 0 volts). At a normal operating drain bias voltage, the potentials on the trenches completely pinch the gate/drift overlap area, where breakdown often occurs for a LDMOS.

Methods of suppressing trench sidewall leakage from a parasitic MOSFET, as a result of incorporation of the floating trench, are also discussed.

This layout technique not only provides higher device breakdown and lower on-resistance, but also offers better hot-carrier and Safe-Operating-Area (SOA) device reliability. The floating trenches may also be applied to a vertical DMOS (VDMOS) with similar benefits.

BRIEF DESCRIPTION OF THE DRAWINGS

FIG. 3a shows a simulation of the edge of the depletion region and the region of high impact ionization at a gate bias of 0 volt and a 40V drain-to-source bias for the device of FIG. 2a.

FIG. 3b shows a simulation of the edge of the depletion region and the region of high impact ionization at a gate bias of Vt+1V and a 25V drain-to-source bias for the device of FIG. 2a.

FIG. 4b is a partial cross-section of FIG. 4a along line 4b-4b of FIG. 4a.

FIG. 4c is a partial cross-section of FIG. 4a along line 4c-4c of FIG. 4a.

Elements labeled with the same numerals in the various figures are the same or similar.

DETAILED DESCRIPTION

The embodiments of the present invention utilize floating trenches in the layout of a DMOS transistor, as opposed to only forming the trench as a ring surrounding the entire transistor, to achieve a higher breakdown voltage and lower on-resistance. The DMOS transistor may be a lateral (LDMOS) or vertical DMOS (VDMOS) transistor. The invention also improves the LDMOS or VDMOS device Safe-Operating-Area (SOA) and reliability. The trenches are relatively easy to integrate into existing processes and are cost effective.

A DMOS transistor, discussed in more detail later, is typically formed of a two-dimensional array of transistors connected in parallel. The individual DMOS transistors are arranged in rows and columns. In one embodiment, a trench is formed between rows of the individual DMOS transistors in the array. An increase in breakdown voltage for the DMOS transistors sandwiched between floating trenches occurs due to the field shaping caused by opposing floating field plates (poly-filled trenches) where the potential on the field plates is the result of capacitive coupling.

Since device reliability (safe-operating-area and hot-carrier lifetime) for a lateral DMOS (LDMOS) transistor is more challenging than for a vertical DMOS (VDMOS) transistor, a LDMOS transistor will be used to demonstrate the field-shaping performed using the present invention, although the invention also applies to VDMOS transistors.

Figure 1:
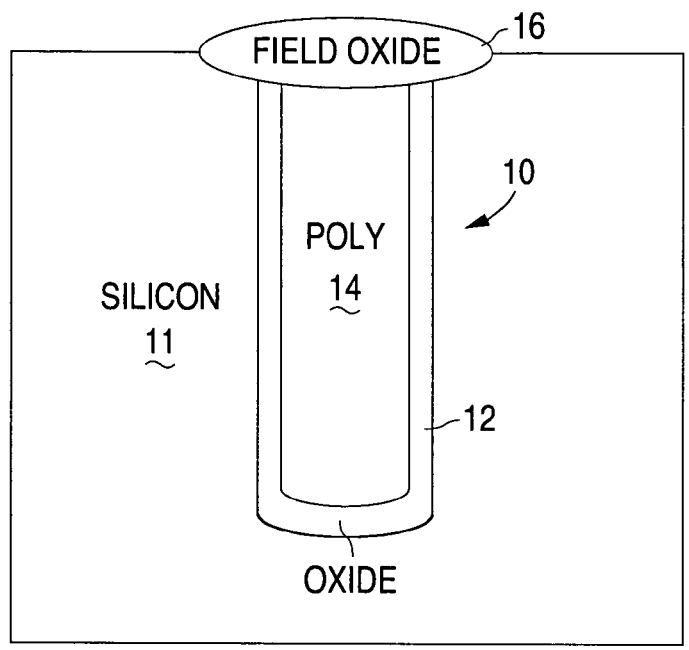
FIG. 1 is a cross-sectional view of a prior art floating trench used for isolation and for edge termination of a transistor.
Figure 2A:
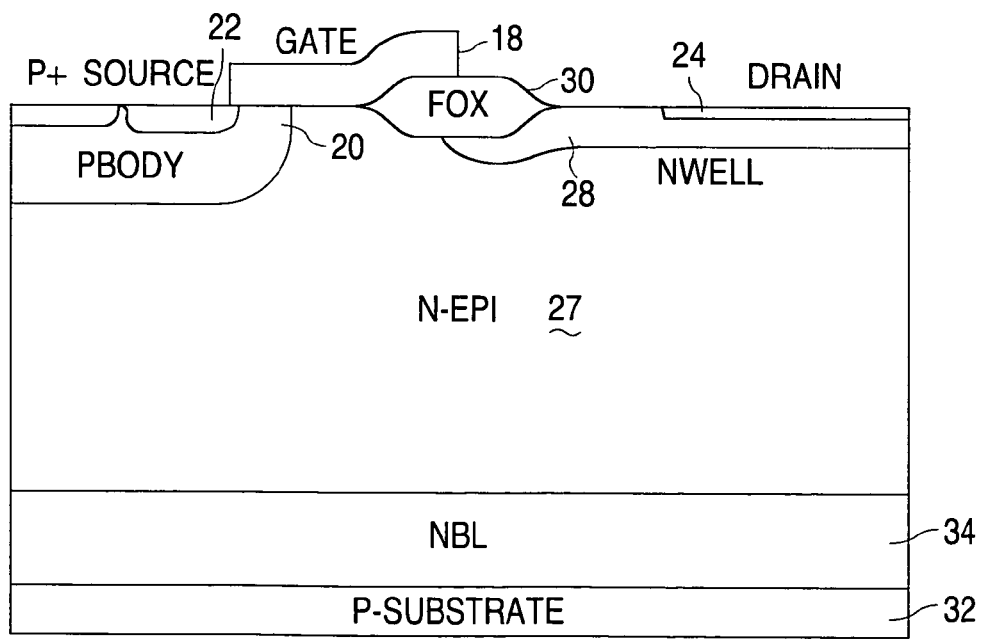
FIG. 2a is a cross-sectional view of a prior art LDMOS transistor.

FIG. 2a shows the cross-section of a high-side NLDMOS transistor. A positive voltage applied to the gate 18 creates a channel at the surface of the p-body 20 so that carriers flow from the n+ source 22 to the n+ drain 24 through the n-type drift region (n-epi 27 and n-well 28). A thin gate oxide (not shown) and a field oxide layer 30 insulate the gate 18 from the silicon. The drift region (n-epi and n-well) is separated from the p-substrate 32 by an n+ buried layer (NBL) 34.

Figure 2B:
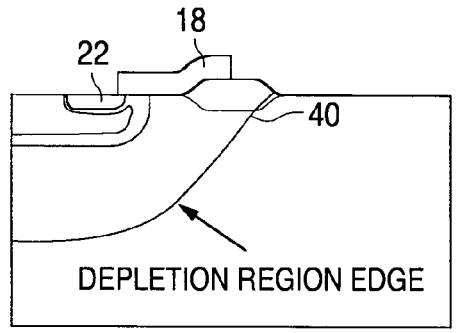
FIG. 2b illustrates the edge of the depletion region in the device of FIG. 2a with a 0 volt gate bias, and a 0 volt drain-to-source bias.
Figure 2C:
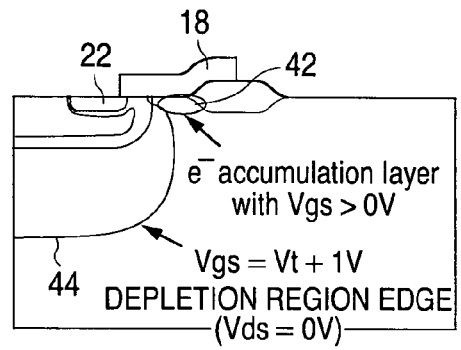
FIG. 2c illustrates the edge of the depletion region in the device of FIG. 2a with a gate bias of Vt+1V, and a 0 volt drain-to-source bias.

In FIG. 2b, the edge of the depletion region (0V gate bias) 40 of the drift region is shown for a 0 volt source and drain voltage. As shown in FIG. 2c, as soon as a positive potential is applied to the gate 18, an accumulation layer 42 of electrons forms under the gate/n-drift overlap area, with a resulting depletion region edge 44. This accumulation layer 42 imposes a breakdown limitation due to the narrowing of the depletion region in the drift region below the gate, which results in a reduced device safe-operating-area (SOA) in LDMOS devices.

Figure 3A:
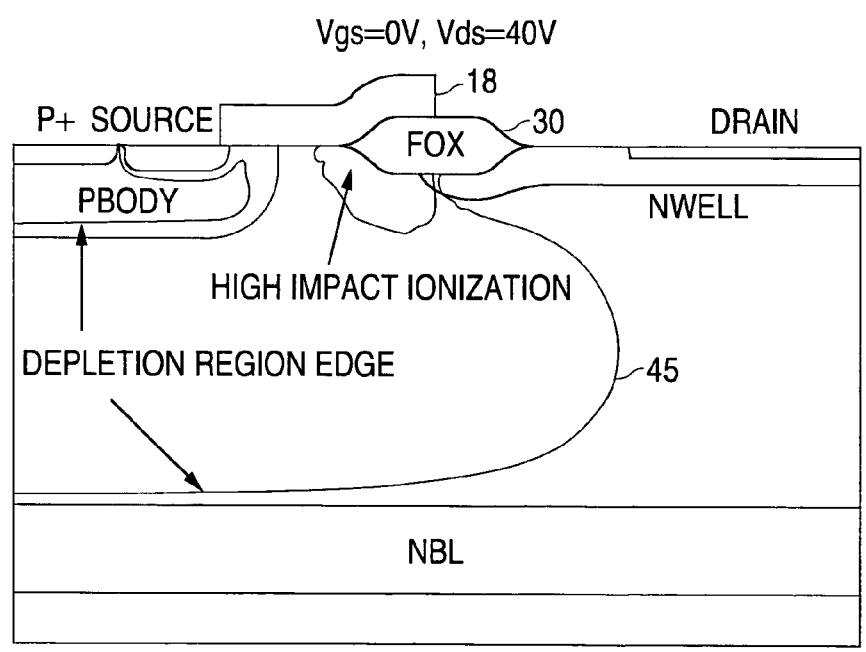
Figure 3B:
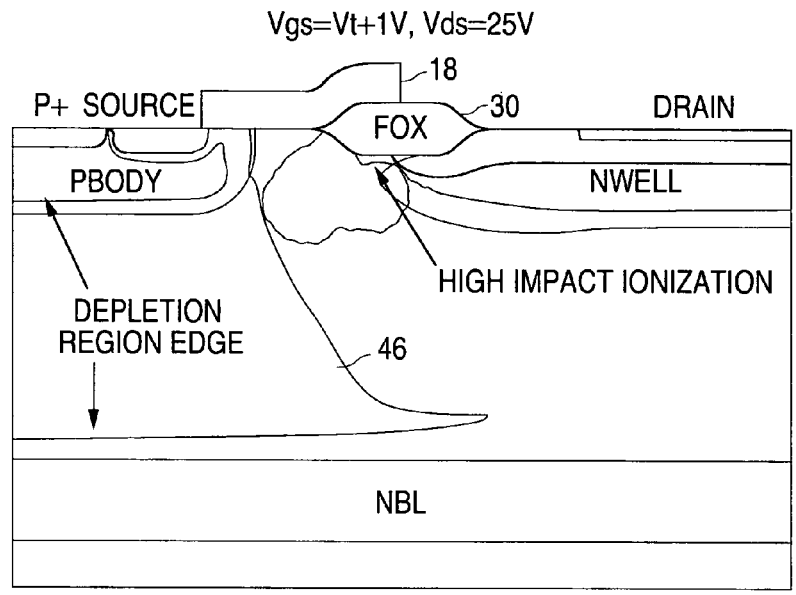

In order to understand the effect, an NLDMOS device is simulated using a 2D simulator to identify the breakdown location with Vgs=0V as shown in FIG. 3a, and with a Vgs of 1V higher than the threshold voltage as shown in FIG. 3b. The depletion region edges are shown as 45 and 46 in FIGS. 3a and 3b, respectively. With the higher Vgs (FIG. 3b), the n-drift region under the gate 18 is no longer depleted as it was in the case of 0V Vgs (FIG. 3a). The reduction in the size of the depletion region in the n-type epi is due to dynamic electron flow that accounts for the charge balance when the device is turned-on. High impact ionization occurs within the accumulation layer near the field oxide 30. This impact ionization limits device SOA and may degrade device reliability, since there is a possibility of injecting "hot" carriers into the field oxide beneath the gate.

Breakdown and Specific On-Resistance Enhancement

Figure 4B:
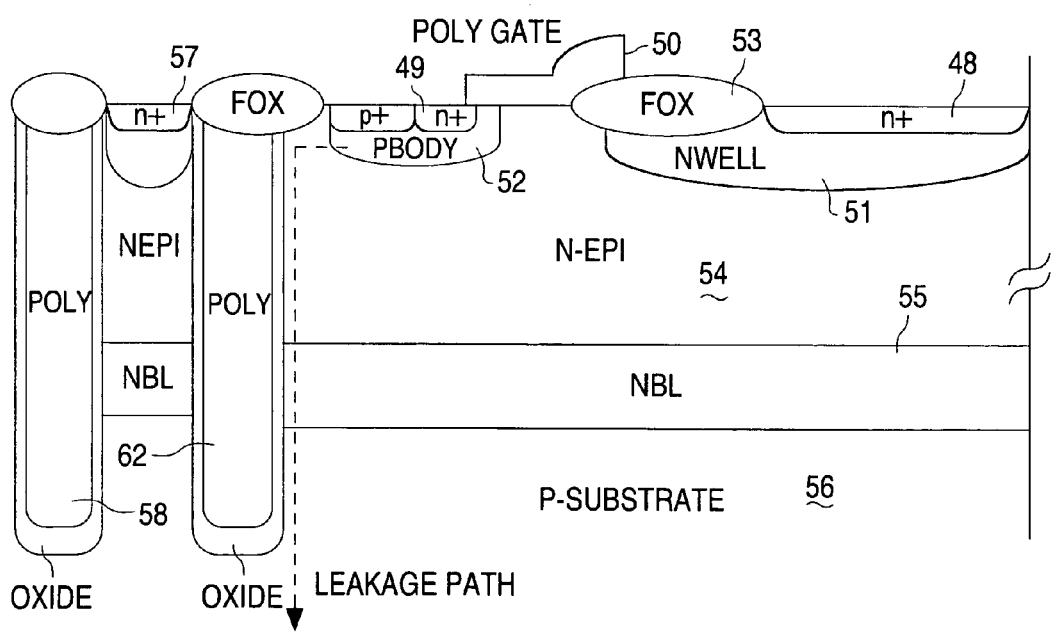
Figure 4A:
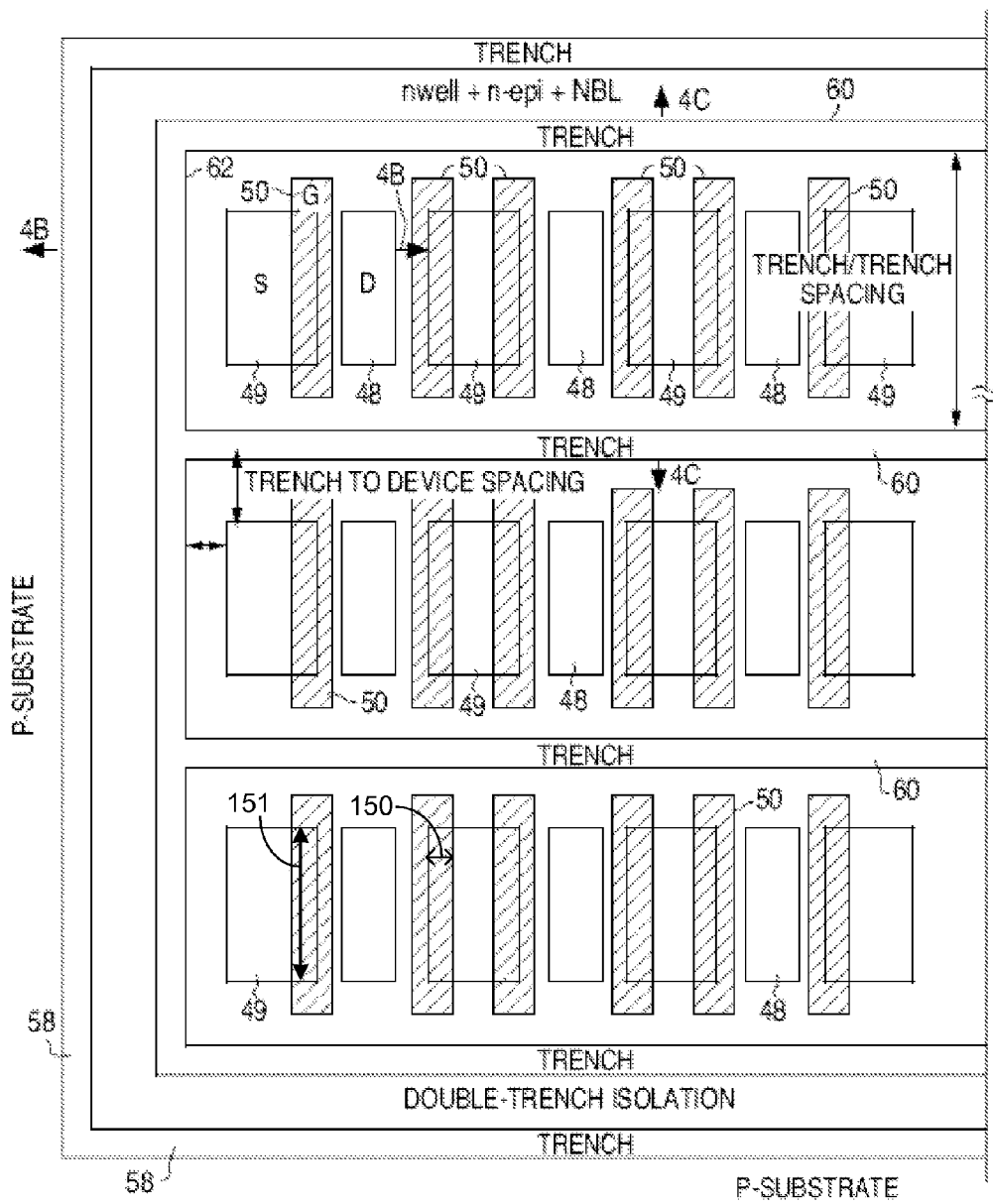
FIG. 4a is a top down view of one embodiment of the invention showing floating trenches running along rows of DMOS transistors in a two-dimensional array of DMOS transistor that are connected in parallel to form a single power DMOS transistor.
Figure 4C:
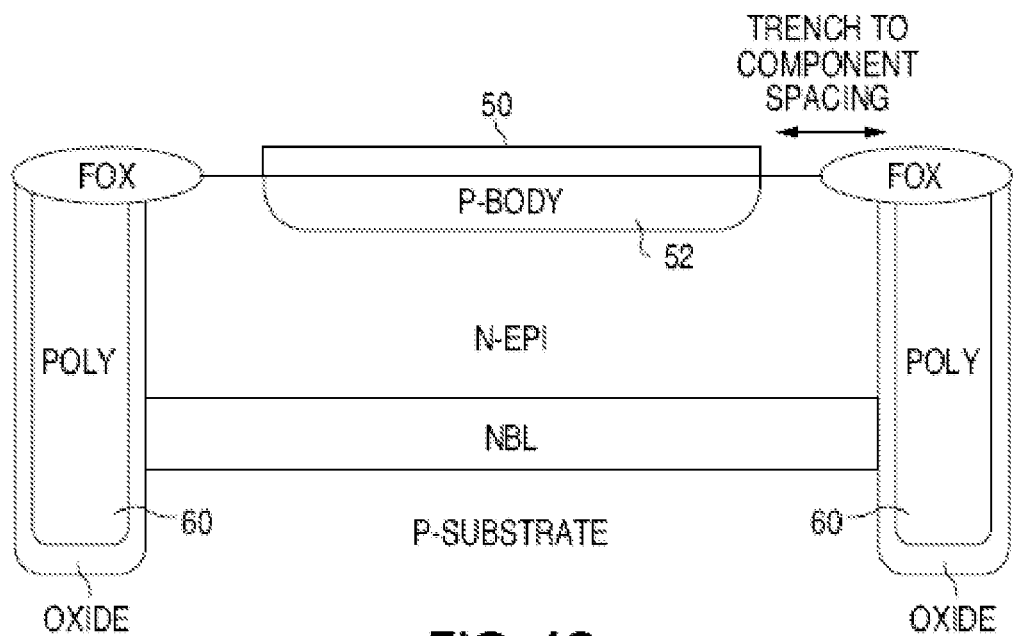

A floating trench in a trench isolated technology is utilized in the invention to improve high-side LDMOS breakdown voltage and to minimize on-resistance. A top view of a device layout embodiment is shown in FIG. 4a, with a device partial cross-section perpendicular to the gate 50 shown in FIG. 4b, and a device partial cross-section through the width of the gate 50 shown in FIG. 4c. All drains 48 are electrically connected together, all sources 49 are electrically connected together, and all gates 50 are electrically connected together. Also shown in FIGS. 4b and 4c are n-well 51, p-body 52, field oxide 53, n-epi 54, buried layer 55, p-substrate 56, and an n+ contact 57 for biasing up to a higher potential the n-epi between the trenches 58 and 62 to reduce parasitic leakage.

Implementation in the example of FIG. 4a involves completely surrounding a high-side LDMOS with one or more floating trench rings 58 (FIG. 4a). There are also trenches 60 running parallel to the rows of DMOS transistors in-between the rows of transistors and connected together with connecting trenches 62. Trenches 60 are in parallel to gate length 150 or perpendicular to gate width 151 of transistors. The function of the outer trench ring 58 is described later. The floating trenches 60 extend into the p-substrate 56 for the desired capacitive coupling.

The floating trench 60 poly running between the rows of transistors is efficiently capacitive coupled to the drain 48 and p-substrate 56 bias in three-dimensional space. The voltage difference between the drain 48 and the floating trench 60 poly due to coupling will induce a space-charge-region (SCR) in the n-epi 54 drift region. The depletion width increases with increasing drain-to-source bias. With the right spacing between trenches 60, the SCR from the opposing trenches 60 will merge at a high drain bias and completely pinch the n-drift/gate overlap region where breakdown often occurs for LDMOS devices. Such "right" spacing can easily be determined by simulation and depends on the device dimensions, coupling ratio, and bias voltages. The high drain bias is typically close to (below or at) the maximum voltage expected by the designer to be used for the device where breakdown is an issue. Such maximum voltage is usually specified in the data sheet for the transistor. In such case, the electric field under the gate (typically doped polysilicon) makes a transition from having a convex curvature to having a concave field (by expanding the depletion region near the gate), due to the absence of an accumulation layer in the n-drift region under the gate. This field-shaping effect improves the breakdown performance of the device, but the degree of improvement can only be quantified with complex 3D simulation.

Figure 5A:
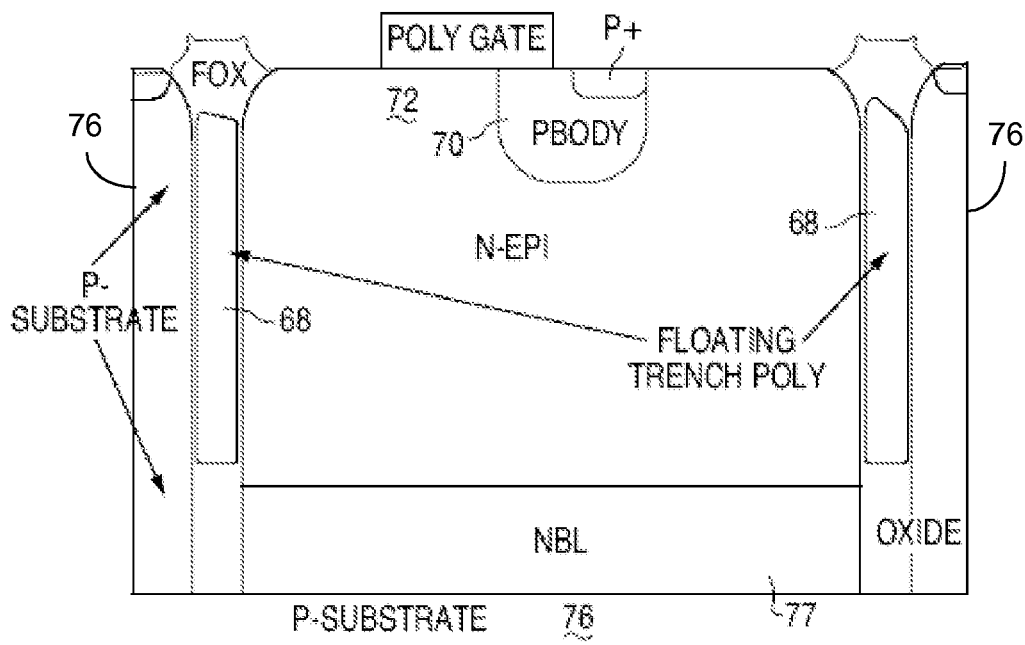
FIG. 5a is a simulation of a cross-section along line 4c-4c of FIG. 4a but with the transistor rotated 90 degrees to better illustrate the effects of the invention.
Figure 5B:
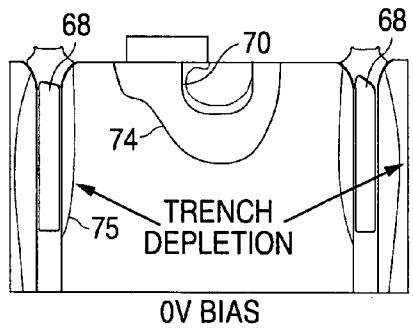
FIG. 5b illustrates the depletion region edges in FIG. 5a at a gate bias of 0 volts.

A simplified 2D simulation is shown in FIG. 5a to demonstrate the concept. FIG. 5a is not a cross-section of FIG. 4a. The function of floating trenches 68 on the n-epi drift region under the gate in FIG. 5a is the same as the function of trenches 60 in FIG. 4a. In FIG. 5a, a p-body junction 70 in an n-epi 72 drift region is sandwiched between two floating trenches 68. The depletion region edge 74 for the structure with 0V gate bias is depicted in FIG. 5b, including the presence of small trench depletion regions 75 in both the n-epi 72 and the p-substrate 76 below the n+ buried layer 77. It should be noted that withour p-substrate 76 surrounding one side of floating trenches 68, no trench depletion 75 would be induced.

Figure 5C:
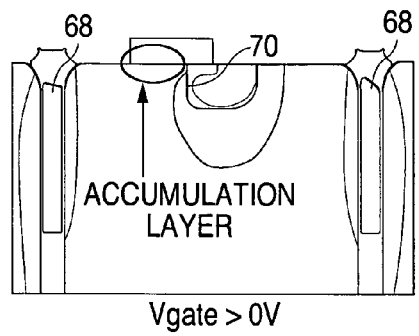
FIG. 5c illustrates the depletion region edges in FIG. 5a at a gate bias >0 volts.
Figure 5D:
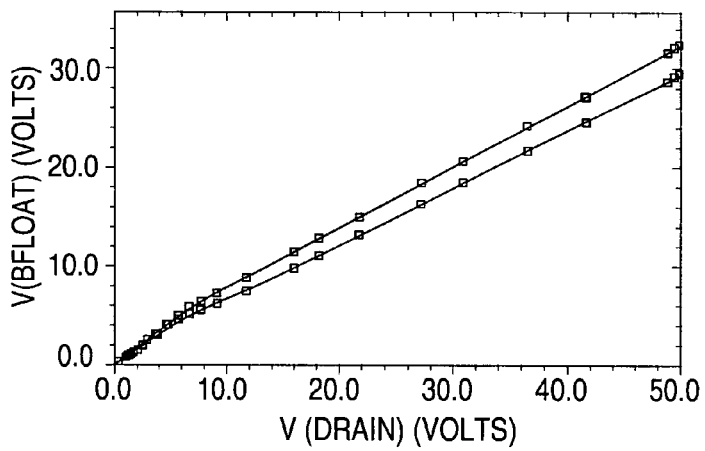
FIG. 5d is a graph of the capacitive coupling ratio of the drain voltage to the floating trench voltage, where opposing floating trenches sandwich the transistor.
Figure 5E:
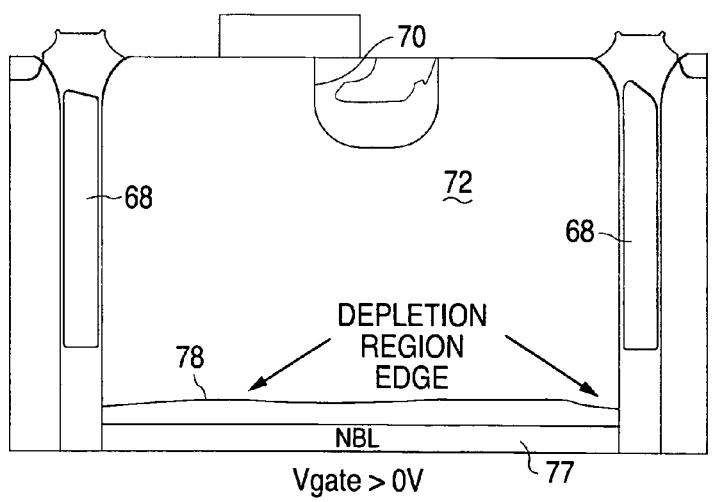
FIG. 5e illustrates the merging of the space charge regions (the depletion regions) below the gate at the operating drain bias voltage.

With any positive bias applied to the poly gate, an accumulation (electron) layer is formed in the n-epi 72 under the gate, pushing the depletion region edge towards the edge of the p-body junction 70 as shown in FIG. 5c. This surface accumulation layer, however, gets depleted laterally if the n-epi 72 is biased to a higher potential, causing the trench 68 poly to float up to some potential through capacitive coupling. The capacitive coupling ratio is shown in FIG. 5d (in this case, ⅗ poly to n-epi coupling). The generated voltage difference as a result of coupling causes the trench-induced depletion to extend laterally. FIG. 5e shows the merging of the depletion regions from opposing trenches 68 at high bias, with the edge of the depletion region 78 lying on top of the n+ buried layer 77. The entire n-epi 72 drift region is completely depleted at this point.

The potential on the floating trench 68 poly in response to the drain bias is rather insensitive to poly resistivity and doping concentration. It could be p+ doped, undoped, or n+ doped poly. The coupling ratio, however, is a strong function of the n-epi 72 resistivity, which is often used as the collector of an NPN transistor in a Power BiCMOS technology. The higher the doping, the lower the device on-resistance, and the stronger the capacitive coupling between the trench and the drain. The exact coupling ratio depends on the relative capacitance of the trench to the n-epi region and the trench to the p-substrate. Trench-to-trench spacing (between trenches parallel to the rows of DMOS transistors in the array) has to be carefully selected in order to completely deplete the n-drift/gate overlap region at the highest drain bias for breakdown enhancement. The degree of field shaping is also a function of the trench-to-component spacing. The smaller the spacing, the stronger the effect. But, too small a distance will induce trench stress-defect leakage in the transistor. Experimental results show no noticeable stress-induced leakage until active device region is moved <0.1 um close to trench. A reasonable spacing here would range from 0.5 um to 2 um, beyond which the coupling efficiency is substantially reduced.

The spacing between two opposing trenches is the key design parameter for high breakdown voltage; it can not be too wide to lose the field-shaping effect. The depletion regions from floating trenches have to merge under n-drift/gate overlap area at or slightly below the highest operating drain voltage. This spacing, however, depends on a number of parameters, one of them being the operating voltage for the device. Trench liner oxide thickness varies for devices with different voltage-ratings, and this thickness is part of the equation that determines the spacing. As mentioned in the previous paragraph, coupling ratio depends on the relative capacitance of the trench to the n-epi region and the trench to the p-substrate, where the capacitance is further determined by the liner oxide thickness and its dielectric constant (e.g., 3.9 for silicon dioxide $SiO_2$). The coupling can further be manipulated with different dielectric materials with different dielectric constants (e.g., 7.5 for $Si_3N_4$, and 4-7.5 for oxynitride).

But, the primary factor in determining proper trench spacing is the drift epi resistivity, since it not only affects the coupling ratio but also determines the width of trench depletion in the drift epi region. Higher resistivity results in less coupling of n-epi to floating poly, but trench depletion is allowed to expend further if the same potential were applied on floating poly (or vice versa). For a device operating at <40V with 650 Å liner oxide, n-epi resistivity of 9 ohm-cm, and p-substrate epi of 28 ohm-cm, the spacing between floating trenches can vary from 8 um to 15 um for the technique to work.

The on-resistance of a LDMOS is often dominated by the low-resistive drain extension region (e.g., the n-well 51 in FIG. 4b or the n-base in a Power BiCMOS technology). Conventionally, lower on-resistance is achieved at the expense of breakdown voltage by extending the low-resistive drain extension layer closer to the source region. The present trench layout technique enables the drain extension layer to extend further towards the source region to reduce on-resistance, while at the same time maintain high device breakdown. This combination is made possible by depleting the n-drift region under the gate at a high drain bias (the expected normal drain bias). In addition, the breakdown location is moved away from gate/n-drift overlap area when this region is entirely depleted by the space charge region (SCR) imposed by opposing trenches. This feature causes current to spread more vertically into the n-buried layer (NBL) at high drain bias, further improving device on-resistance and hot-carrier lifetime. The precise breakdown location, however, can only be determined with complex 3D simulation.

This enhanced breakdown technique also works for a p-channel lateral or vertical DMOS transistor.

Methods of Suppressing Trench Sidewall Leakage

For a high-side LDMOS, where the drain is isolated from the p-substrate by the NBL as shown in FIG. 4b, a parasitic device is formed. The parasitic PMOS transistor is composed of a p-type (p-body and/or p-well) source, an n-epi body, a p-substrate drain, and a trench poly gate. The voltage offset caused by the coupling ratio between the drain and the floating trench poly will turn on the parasitic PMOS, causing leakage current to flow along the trench side-wall to the p-type substrate. The presence of the NBL in theory should increase the threshold voltage for this parasitic, but experimental results show severe segregation of n-dopant at the trench/NBL interface during trench liner oxidation. The problem however can be solved by adding a second trench ring (trench 58 in FIG. 4a) biased to a higher potential, but not so high as to lose the field shaping effect. It must be just high enough to render the parasitic PMOS transistor inoperable. Double-trench isolation is only needed at the device perimeter where the drain-to-trench coupling is the weakest. Here it is attenuated by p-substrate/trench coupling, resulting in a more negative potential on the trench with respect to the n-epi.

Figure 6:
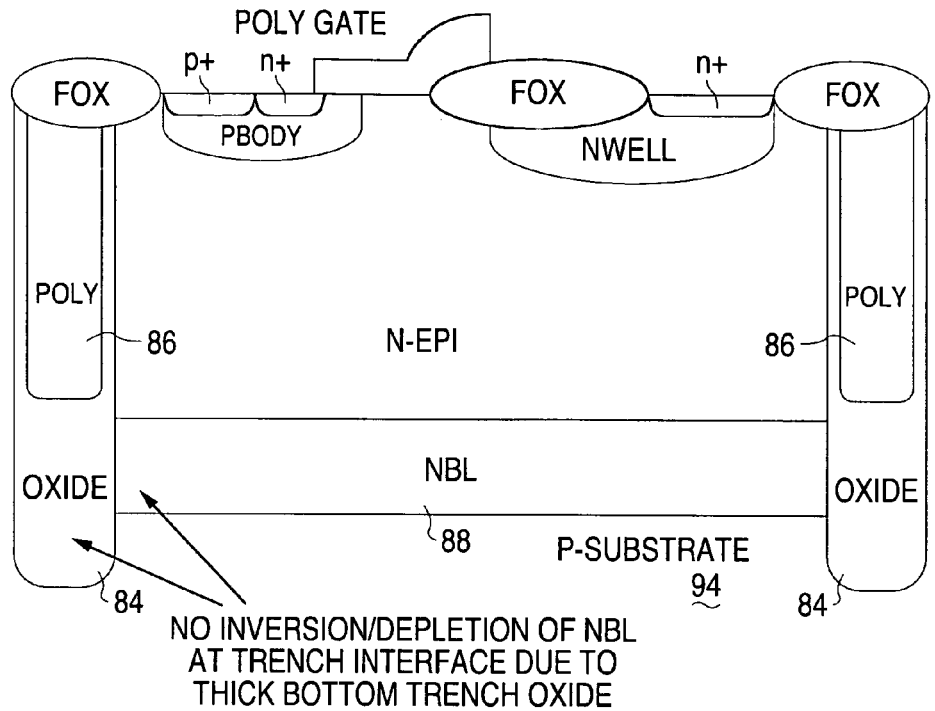
FIG. 6 is a cross-section of a DMOS transistor sandwiched between floating trenches, where the transistor is rotated 90 degrees from actual to better illustrate the invention, and where a thick oxide partially fills the trenches to prevent inversion of the n-buried layer (NBL).
Figure 7:
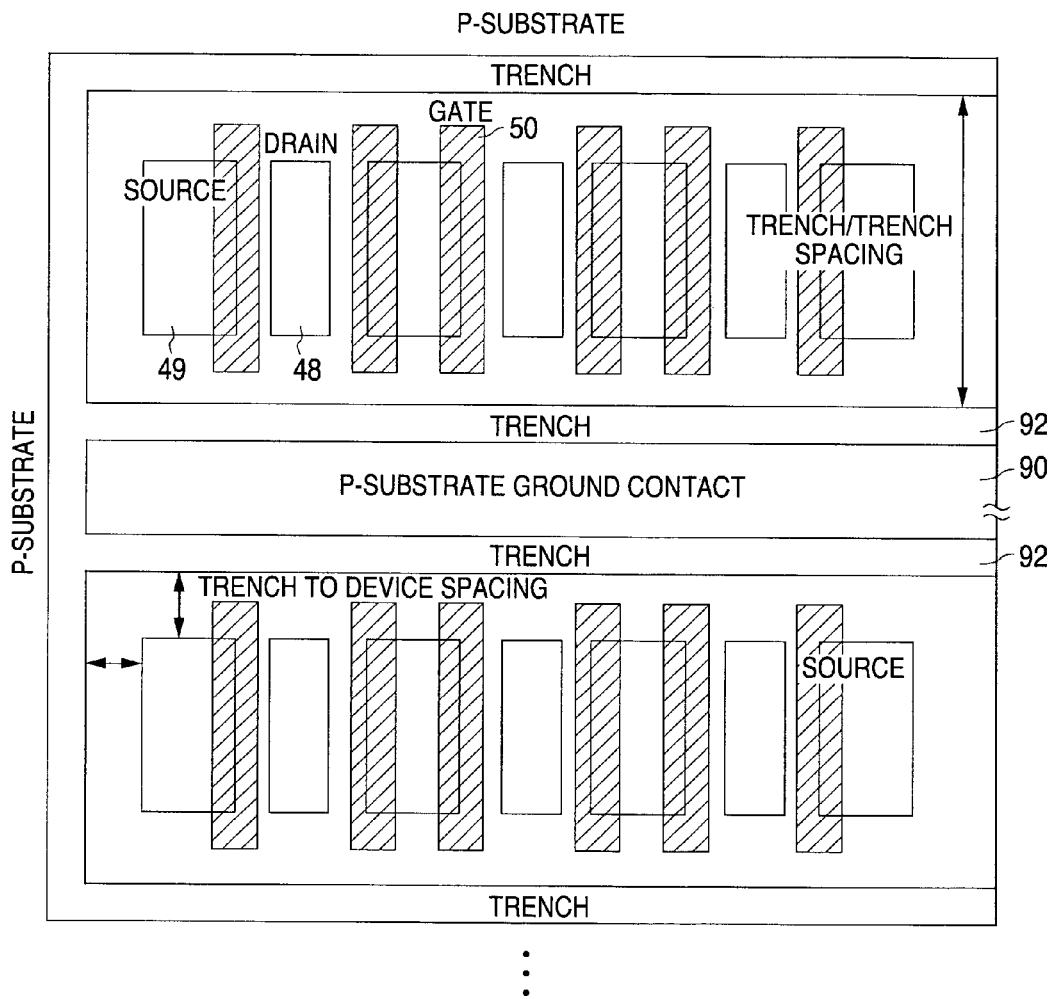
FIG. 7 is a top view of a DMOS transistor and trench layout with a p-substrate ground contact region between trenches when the shallow trenches of FIG. 6 are used.

As shown in FIG. 6, a method of suppressing trench sidewall leakage without double-trenching is to increase the trench bottom liner oxide 84 thickness so the poly 86 is higher than the n+ buried layer 88. This n+ buried layer 88 can never be depleted or inverted, thus completely eliminating trench sidewall leakage. However, as shown in FIG. 7, a thin p-substrate strip with ground contact 90 will need to be added in the transistor array between the trenches 92 for the technique to work since, otherwise, the floating poly 86 potential will be too close to the drain voltage and not completely deplete the drift region. The strip is a narrow p region formed completely through the n-epi and contacting the p+ substrate. This strip can be formed as a narrow p-well or p-epi with a low or high doping concentration. The ground contact 90 may be metal for reduced resistivity, or the p-strip may be connected to ground elsewhere. The p-substrate grounded strip is needed since, due to the increased distance between the shallow floating poly 86 and substrate 94 in FIG. 6, there is a decrease in capacitive coupling between the floating trench poly 86 and the p-substrate 94. Providing the p-substrate strip/contact 90 close to the poly 86 lowers the potential of the poly 86 in order to form a depletion region in the adjacent n-drift epi. The presence of the strip/contact 90 thus lowers the trench potential and creates a trench depletion region in both the p-type substrate and n-type drift epi layer.

Device Reliability (SOA and Hot-Carrier) Improvement

Figure 8A:
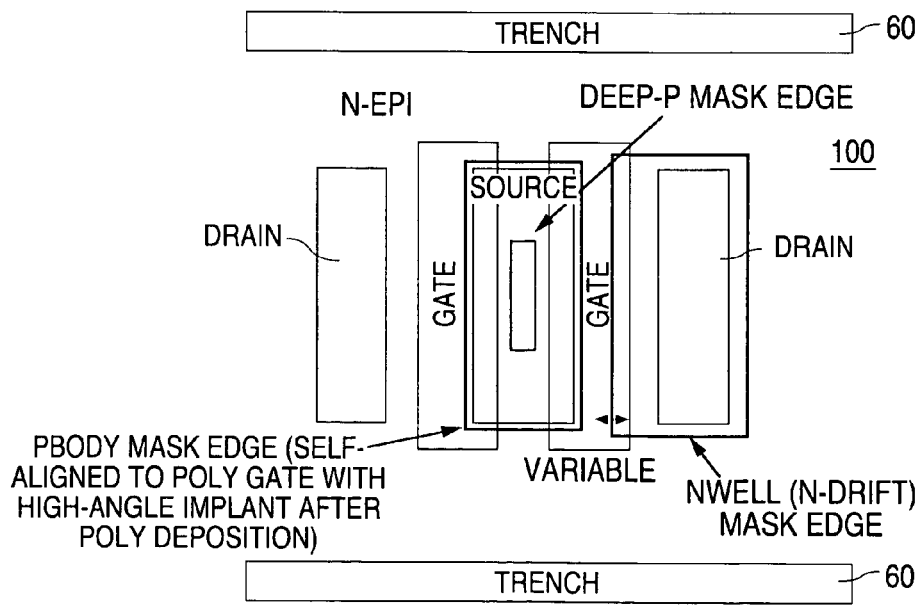
FIG. 8a is a top view of a DMOS transistor and trench layout where a more heavily-doped and deeper p-type junction is added in the p-body contact to reduce resistance so as to prevent turning on the lateral parasitic NPN bipolar transistor.
Figure 8B:
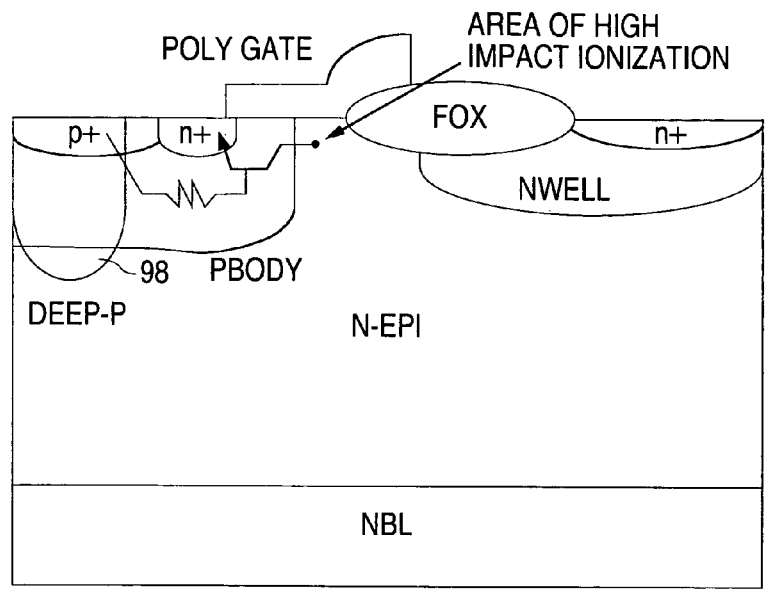
FIG. 8b is a partial cross-section of the device of FIG. 8a showing the lateral NPN parasitic transistor.
Figure 8C:
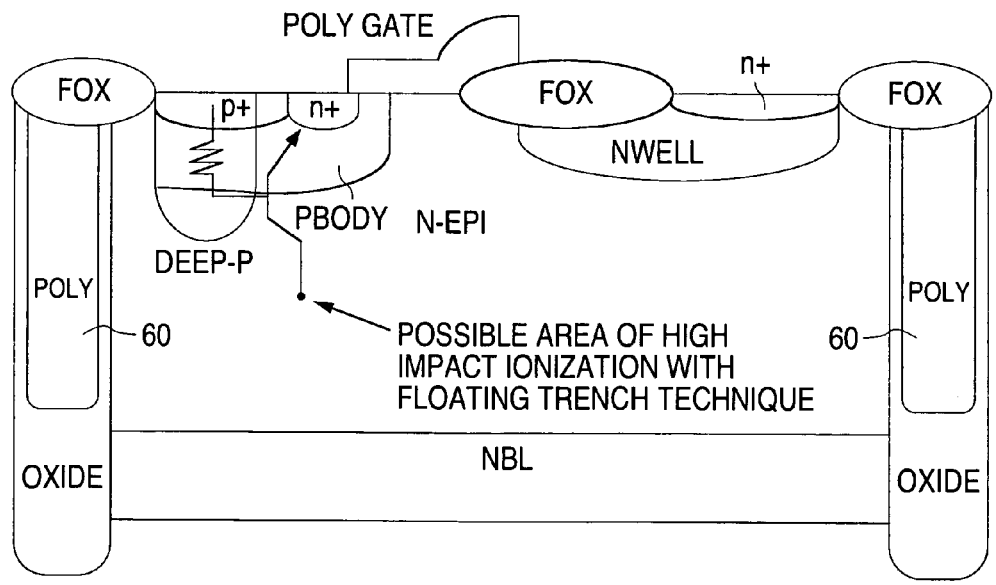
FIG. 8c is a partial cross-section of the device of FIG. 8a showing how the lateral NPN parasitic transistor has effectively changed into a vertical NPN parasitic transistor as a result of the floating trenches, having a less significant effect on DMOS transistor performance.

It is well known that Safe-Operating-Area (SOA) for a lateral power DMOS is limited by the parasitic NPN bipolar action. Forward bias Vbe (emitter/base voltage) trigger voltage is caused by the voltage drop between the p-body in the channel and the p-body contact that is a result of hole current from impact ionization. As shown in the top layout view of FIG. 8a and the cross-section of FIG. 8b, a more heavily-doped and deeper p-type junction 98 is usually added in the p-body contact to reduce resistance. The deep-p mask edge 100 is shown in FIG. 8a. However, this does not improve device SOA substantially, since most of voltage drop is caused by the pinched p-type body under the n+ source. The location of the high impact ionization region where "hot" holes are generated dominates device SOA. Hot holes must travel through the high-resistance pinched p-type body to be collected. With the floating trench layout technique of the present invention, the breakdown location may be pushed deeper into the n-epi region due to complete depletion of the n-drift region under gate, turning the parasitic lateral NPN transistor into a vertical NPN transistor as shown in FIG. 8c. (The transistor of FIG. 8c is rotated 90 degrees relative to the trenches 60 for ease of explanation.) This characteristic not only benefits device SOA by significantly reducing base resistance of the NPN transistor, with hot holes collected by the more-heavily doped deep-p junction, but also improves device reliability with much better hot-carrier lifetime by moving the breakdown away from field oxide.

The above trench layout is also applicable to a vertical DMOS. In one example, the n+ drain region on the surface is connected to the NBL by an n+ sinker. Other types of VDMOS transistors are also suitable.

While particular embodiments of the present invention have been shown and described, it would be obvious to those skilled in the art that changes and modifications may be made without departing from this invention in its broader aspects and, therefore, the appended claims are to encompass within their scope all such changes and modifications as fall within the true spirit and scope of this invention.

What is claimed is:

1. A transistor structure comprising:
   a lateral DMOS transistor comprising a source, a drain, a body region, a gate, and a drift region between the drain and the body region, the drift region having a conductivity type, the DMOS transistor being built on a substrate having a conductivity type opposite to that of the drift region; and
   at least one pair of parallel opposing floating trenches, wherein a controllable current path exists in-between opposing floating trenches in the drift region, each floating trench comprising a conductive or semiconductor material that has no external electrical contact, the conductive or semiconductor material extending into the substrate and being insulated from any surrounding material by a dielectric,
   the trenches having a length dimension running along the drift region between the source and drain, the gate having a width dimension running along the body region, the gate width dimension being substantially perpendicular to the length of the opposing floating trenches,
   wherein an operating bias voltage applied to the drain capacitively couples a potential to the opposing floating trenches through the drift region and the substrate,
   the opposing floating trenches being arranged so that the potential coupled to the opposing floating trenches causes a first lateral depletion region to extend from a first one of the opposing floating trenches toward an opposing second one of the opposing floating trenches, and causes a second lateral depletion region to extend from the second one of the opposing floating trenches toward the first one of the opposing floating trenches, such that the first lateral depletion region and the second lateral depletion region merge in the drift region at a certain drain bias.

2. The structure of claim 1 wherein the DMOS transistor comprises a two-dimensional array of lateral DMOS transistors arranged in rows, each lateral DMOS transistor comprising a source, a drain, a body region, a gate, and a drift region between the drain and the body region, the drift region having a conductivity type, the DMOS transistors being built on the substrate having a conductivity type opposite to that of the drift regions, the gate having a width dimension substantially perpendicular to a row of lateral DMOS transistors,
   wherein at least one pair of parallel opposing floating trenches comprises a plurality of pairs of opposing floating trenches that run along and within a plurality of rows of lateral DMOS transistors, and a controllable current path exists in-between each pair of opposing floating trenches in the drift region, with the gate width dimension substantially perpendicular to the length of the opposing floating trenches.

3. The structure of claim 1 wherein the DMOS transistor comprises at least a row of lateral DMOS transistors, each lateral DMOS transistor comprising a source, a drain, a body region, a gate, and a drift region between the drain and the body region, the drift region having a conductivity type, the DMOS transistors being built on the substrate having a conductivity type opposite to that of the drift regions, the gate having a width dimension substantially perpendicular to a row of lateral DMOS transistors, wherein the parallel opposing floating trenches run on opposite sides of each row, there being at least a portion of a row of lateral DMOS transistors between a pair of opposing floating trenches, wherein a controllable current path exists in-between each pair of opposing floating trenches in the drift region, with the gate width dimension substantially perpendicular to the length of the opposing floating trenches.

4. The structure of claim 1 wherein the drain is a heavily doped region of a first conductivity type, the drain being formed in a lighter doped well region of the first conductivity type, the source, drain, well region, and body region being formed in
   an epitaxial layer of the first conductivity type, the substrate being of a second conductivity type.

5. The structure of claim 4 wherein the drift region comprises a portion of the epitaxial layer under the gate.

6. The structure of claim 5 wherein at least one pair of parallel opposing floating trenches completely deplete the epitaxial region under the gate at a certain drain bias.

7. The structure of claim 4 further comprising a thick field oxide region between the gate and the well region.

8. The structure of claim 1 wherein each trench comprises an oxide liner and is at least partially filled with polysilicon that extends into the substrate.

9. The structure of claim 1 wherein the source is a region of a first conductivity type and the body region is of a second conductivity type, the structure further comprising a deep highly doped region of the second conductivity type extending completely through the body region for lowering a gain of a lateral parasitic bipolar transistor.

10. The structure of claim 1 wherein the spacing between opposing floating trenches is set to create a lateral depletion region that is able to merge in the drift region from each opposing floating trench at a drain bias voltage that is at or below a maximum rated voltage for the lateral DMOS transistor.

11. The structure of claim 1 wherein at least one pair of parallel opposing floating trenches completely depletes the drift region under the gate at a certain drain bias.

12. The structure of claim 1 further comprising a thick field oxide region between the gate and the drift region.

13. A lateral DMOS transistor structure comprising a source, a drain, a body region, a gate, and a drift region between the drain and the body region, wherein the source, drift region, and drain are of a first conductivity type, and the body region is of a second conductivity type, the structure further comprising an epitaxial layer of a first conductivity type in which is formed the source, drain, drift region, and body region, and further comprising a substrate of the second conductivity type and a highly doped buried layer of the first conductivity type between the substrate and the epitaxial layer; and at least one pair of parallel opposing floating trenches, wherein a controllable current path exists in-between opposing floating trenches in the drift region, each floating trench comprising a conductive or semiconductor material that has no external electrical contact, the conductive or semiconductor material being insulated from any surrounding material by a dielectric, the trenches having a length dimension running along the drift region between the source and drain, the gate having a width dimension running along the body region, the gate width dimension being substantially perpendicular to the length of the opposing floating trenches, wherein the opposing floating trenches are arranged such that an operating bias voltage applied to the drain capacitively couples a potential to the opposing floating trenches through the drift region and the substrate, the opposing floating trenches being arranged so that the potential coupled to the opposing floating trenches causes a first lateral depletion region to extend from a first one of the opposing floating trenches toward an opposing second one of the opposing floating trenches, and causes a second lateral depletion region to extend from the second one of the opposing floating trenches toward the first one of the opposing floating trenches, such that the first lateral depletion region and the second lateral depletion region merge in the drift region at a certain drain bias.

14. The structure of claim 13 wherein each trench comprises an oxide liner and is at least partially filled with polysilicon, wherein the polysilicon extends into the substrate.

15. The structure of claim 13 wherein each trench comprises an oxide liner and is at least partially filled with polysilicon, wherein the polysilicon does not extend into the substrate, the structure fUrther comprising a substrate contact extending from the substrate to a surface of the structure running on outside edges of opposing floating trench pairs, wherein no transistor regions are present, for establishing capacitively coupling on the floating trenches.

16. The structure of claim 13 wherein each opposing floating trench causes at least 5000 of the lateral merging of depletion region in the epitaxial region between parallel opposing floating trenches at a certain drain bias.

17. The structure of claim 13 wherein the spacing between opposing floating trenches is set to create a lateral depletion region that is able to merge in the drift region from each opposing floating trench at a drain bias voltage that is at or below a maximum rated voltage for the lateral DMOS transistor.

18. The structure of claim 13 wherein at least one pair of parallel opposing floating trenches completely depletes the drift region under the gate at a certain drain bias.

19. The structure of claim 13 further comprising a thick field oxide region between the gate and the drift region.

20. The structure of claim 13 wherein the source is a region of a first conductivity type and the body region is of a second conductivity type, the structure further comprising a deep highly doped region of the second conductivity type extending completely through the body region for lowering a gain of a lateral parasitic bipolar transistor.

* * * * *

UNITED STATES PATENT AND TRADEMARK OFFICE
CERTIFICATE OF CORRECTION

PATENT NO. : 7,535,057 B2  
APPLICATION NO. : 11/234519  
DATED : May 19, 2009  
INVENTOR(S) : Robert Kou-Chang Yang Page 1 of 1

It is certified that error appears in the above-identified patent and that said Letters Patent is hereby corrected as shown below:

Column 10, line 7, claim 15: Cancel "fUrther" and substitute --further--.

Column 10, line 13, claim 16: Cancel "5000" and substitute --50%--.

Signed and Sealed this

Eleventh Day of August, 2009

David J. Kappos
*Director of the United States Patent and Trademark Office*